US012692589B2

(12) United States Patent
Kim et al.

(10) Patent No.: US 12,692,589 B2
(45) Date of Patent: Jul. 28, 2026

(54) METHOD FOR MANUFACTURING MULTILAYER STRUCTURE

(71) Applicants: KOREA INSTITUTE OF SCIENCE AND TECHNOLOGY, Seoul (KR); Inha University Research and Business Foundation, Incheon (KR)

(72) Inventors: Hyung-Jun Kim, Seoul (KR); Rino Choi, Seoul (KR); Seung-Hwan Kim, Seoul (KR); Daeyoon Baek, Seoul (KR)

(73) Assignees: Korea Institute Of Science And Technology, Seoul (KR); Inha University Research And Business Foundation, Incheon (KR)

(*) Notice: Subject to any disclaimer, the term of this patent is extended or adjusted under 35 U.S.C. 154(b) by 0 days.

(21) Appl. No.: 18/501,259

(22) Filed: Nov. 3, 2023

(65) Prior Publication Data

US 2024/0200185 A1      Jun. 20, 2024

(30) Foreign Application Priority Data

Dec. 14, 2022    (KR) ......................... 10-2022-0174710

(51) Int. Cl.
| | |
|---|---|
| *C23C 14/08* | (2006.01) |
| *C23C 14/22* | (2006.01) |
| *C23C 14/34* | (2006.01) |
| *C23C 14/35* | (2006.01) |
| *H01J 37/34* | (2006.01) |

(52) U.S. Cl.
CPC .......... *C23C 14/081* (2013.01); *C23C 14/225* (2013.01); *C23C 14/3414* (2013.01); *C23C 14/35* (2013.01); *H01J 37/3426* (2013.01)

(58) Field of Classification Search
CPC . C23C 14/3414; C23C 14/081; C23C 14/225; C23C 14/226; C23C 14/08; C23C 14/35; H01J 37/3426
See application file for complete search history.

(56) References Cited

U.S. PATENT DOCUMENTS 8,236,152 B2 *    8/2012    Guo .................... H01J 37/3423
                                                    204/298.26
8,299,363 B2    10/2012    Iijima et al.
                        (Continued)

FOREIGN PATENT DOCUMENTS

| | | |
|---|---|---|
| CN | 114945701 A | 8/2022 |
| JP | 2004-303920 A | 10/2004 |

(Continued)

OTHER PUBLICATIONS

Machine Translation KR 102243631 (Year: 2021).*

(Continued)

*Primary Examiner* — Michael A Band
(74) *Attorney, Agent, or Firm* — Harness, Dickey & Pierce, P.L.C.

(57) ABSTRACT

Provided is a method for manufacturing a multilayer structure. The method for manufacturing the multilayer structure includes providing a substrate in a chamber, providing a target in the chamber, and allowing a target material to be incident into the substrate so as to form a material layer. The target includes magnesium oxide or beryllium oxide. An incident angle of the target material to the substrate is about 9.14° or less.

13 Claims, 10 Drawing Sheets

(56)  References Cited

U.S. PATENT DOCUMENTS

| | | | |
|---|---|---|---|
| 2005/0079297 A1* | 4/2005 | Ota | B32B 17/06 |
| | | | 428/1.32 |
| 2013/0048494 A1 | 2/2013 | Kikuchi et al. | |
| 2016/0118254 A1 | 4/2016 | Yamazaki | |
| 2016/0362812 A1* | 12/2016 | Yang | C23C 14/081 |
| 2021/0225647 A1 | 7/2021 | Passlack et al. | |
| 2021/0265554 A1 | 8/2021 | Kim et al. | |

FOREIGN PATENT DOCUMENTS

| | | | |
|---|---|---|---|
| JP | 5103443 | B2 | 12/2012 |
| KR | 10-2013-0028726 | A | 3/2013 |
| KR | 10-2020-0050862 | A | 5/2020 |
| KR | 10-2243631 | B1 | 4/2021 |
| WO | 2011/030826 | A1 | 3/2011 |

OTHER PUBLICATIONS

A. G. Dirks and H. J. Leamy, Columnar Microstructure in Vapor-Deposited Thin Films, Thin Solid Films 47 (1977) 219-233.

Gregory Abadias et al., Texture and Stress Evolution in HfN Films Sputter-Deposited at Oblique Angles, Coatings 2019 , 9, 712.

Korean Examination Report dated Oct. 18, 2024 issued in Korean Patent Application No. 10-2022-0174710.

Korean Notice of Allowance dated Jun. 23, 2025 issued in Korean Patent Application No. 10-2022-0174710.

* cited by examiner

METHOD FOR MANUFACTURING MULTILAYER STRUCTURE

CROSS-REFERENCE TO RELATED APPLICATIONS

This U.S. non-provisional patent application claims priority under 35 U.S.C. § 119 of Korean Patent Application No. 10-2022-0174710, filed on Dec. 14, 2022, the entire contents of which are hereby incorporated by reference.

BACKGROUND

The present disclosure herein relates to a method for manufacturing a multilayer structure. More specifically, the present invention herein relates to a method of manufacturing a multilayer structure including a material layer.

A general sputtering device generates an electric field by applying a bias voltage to an electrode disposed inside a chamber, generates plasma by providing an inert gas affected by the electric field to the inside of the chamber, and allows ions of the plasma, which is accelerated by the electric field, to collide with a target so as to sputter the target. Target materials of the sputtered target may be deposited on a substrate.

SUMMARY

The present disclosure provides a method for forming a material layer including crystals having the same crystal orientation by using a sputtering device.

An embodiment of the inventive concept provides a method for manufacturing a multilayer structure, the method including: providing a substrate in a chamber; providing a target in the chamber; and allowing a target material to be incident into the substrate so as to form a material layer, wherein the target includes magnesium oxide or beryllium oxide, and an incident angle of the target material to the substrate is about 9.14° or less.

In an embodiment of the inventive concept, a method for manufacturing a multilayer structure includes: providing a substrate in a chamber; providing a target in the chamber; and allowing a target material discharged from the target to be incident into the substrate so as to form a material layer, wherein crystals of the material layer have the same crystal orientation, and an incident angle of the target material to the substrate is about 9.14° or less.

In an embodiment of the inventive concept, a method for driving a sputtering device includes: providing a substrate on a substrate support structure within a chamber; providing a target on a target support structure within the chamber; supplying a gas into the chamber; and supplying power to the target support structure to allow a target material to be incident into the substrate, wherein an incident angle of the target material to the substrate is about 9.14° or less.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, a lamination structure and a method for manufacturing the same according to embodiments of the inventive concept will be described in detail with reference to the accompanying drawings.

Figure 1:
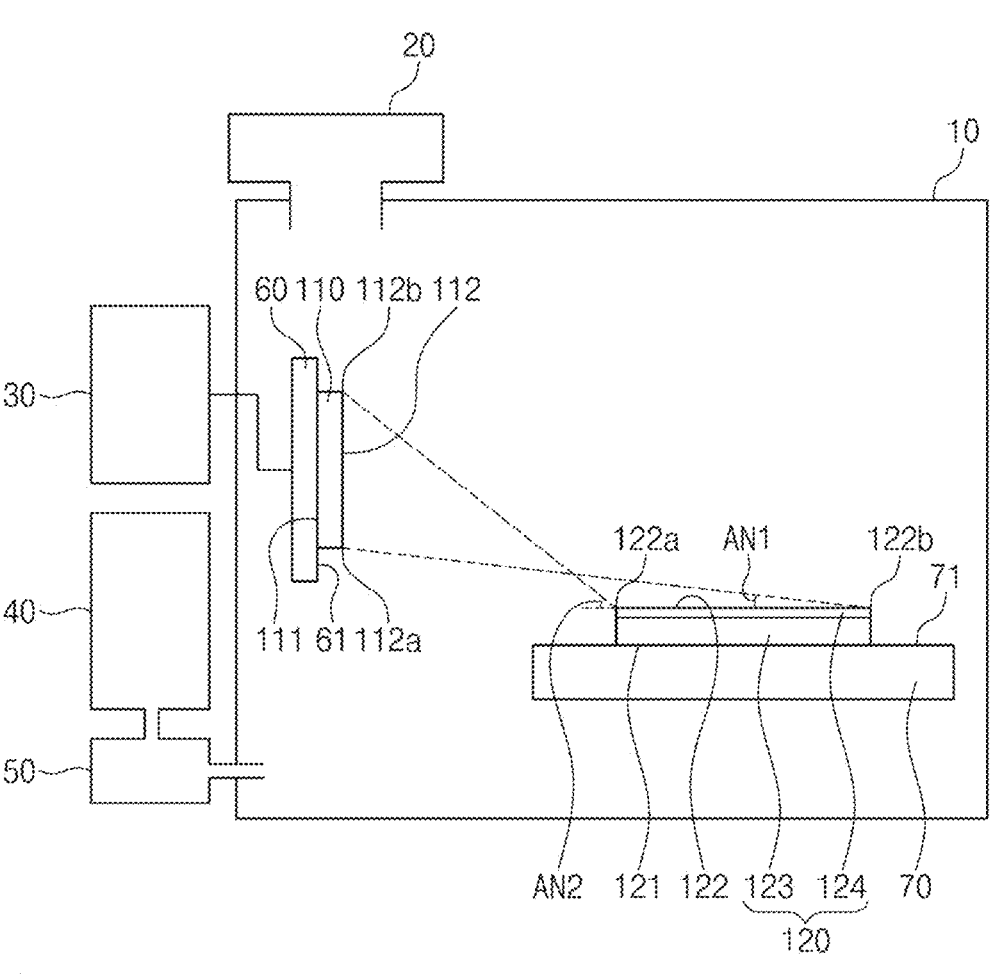
FIG. 1 is a view for explaining a sputtering device according to some embodiments.
Figure 1:
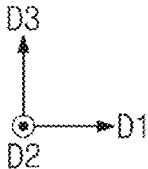

FIG. 1 is a view for explaining a sputtering device according to some embodiments.

Referring to FIG. 1, a sputtering device may include a chamber 10, a pump 20, a power supply 30, a gas supply 40, a mass flow controller 50, a target support structure 60, and a substrate support structure 70.

The chamber 10 may include an empty space therein. The empty space inside the chamber 10 may be sealed. A material layer may be manufactured in the empty space inside the chamber 10. The chamber 10 may be a chamber for performing a sputtering process and may include, for example, aluminum oxide or yttrium oxide.

The pump 20 may be connected to the chamber 10. The pump 20 may pump a gas within the chamber 10. For example, the pump 20 may pump a pressure in the chamber 10 to have a high degree of vacuum.

The power supply 30 may be electrically connected to the target support structure 60. The power supply 30 may supply power to the target support structure 60. In some embodiments, the power supply 30 may supply RF power or DC power to the target support structure 60.

The gas supply 40 may be connected to the chamber 10. The gas supply 40 may supply a gas into the chamber 10. For example, the gas supply 40 may supply an inert gas such as an argon (Ar) gas into the chamber 10.

The mass flow controller 50 may connect the gas supply 40 to the chamber 10. A gas may be supplied from the gas supply 40 to the mass flow controller 50, and a gas may be supplied from the mass flow controller 50 to the chamber 10. The mass flow controller 50 may control an amount of gas supplied to the chamber 10.

In some embodiments, the gas supply 40 may be directly connected to the chamber 10, and the gas may be directly supplied from the gas supply 40 to the chamber 10.

The target support structure 60 may be provided within the chamber 10. The target support structure 60 may support the target 110. The target support structure 60 may include an electrode electrically connected to the power supply 30. The electrode of the target support structure 60 may receive RF power or DC power from the power supply 30. The target 110 may include, for example, magnesium oxide (MgO) or beryllium oxide (BeO).

In some embodiments, the target support structure 60 may further include a magnet. In this case, the sputtering device may be a magnetron sputtering device.

The substrate support structure 70 may be provided within the chamber 10. The substrate support structure 70 may support the substrate 120. For example, the substrate support structure 70 may be a chuck for fixing the substrate 120.

The substrate 120 may include a base layer 123 and an insulating layer 124 on the base layer 123. The base layer 123 may include, for example, silicon (Si). The insulating layer 124 may include, for example, amorphous silicon oxide (SiO$_2$).

After the gas is supplied from the gas supply 40, the power may be supplied from the power supply 30 to generate plasma in the chamber 10. Ions of the plasma may collide with the target 110, and a target material may be emitted from the target 110. The target material emitted from the target 110 may be incident into the substrate 120.

The substrate support structure 70 may include a substrate support surface 71. A substrate 120 may be provided on the substrate support surface 71. The substrate support surface 71 may be parallel to a first direction D1 and a second direction D2. The first direction D1 and the second direction D2 may cross each other. For example, the first direction D1 and the second direction D2 may be orthogonal to each other. The substrate support surface 71 may be orthogonal to a third direction D3. The third direction D3 may cross the first direction D1 and the second direction D2. For example, the third direction D3 may be orthogonal to the first direction D1 and the second direction D2.

The target support structure 60 may include a target support surface 61. A target 110 may be provided on the target support surface 61. In some embodiments, the target support surface 61 may be parallel to the second direction D2 and the third direction D3 and be orthogonal to the first direction D1. However, embodiments of the inventive concept are not limited thereto.

The target 110 may include a target contact surface 111 and a target exposure surface 112. The target contact surface 111 may be a surface that is in contact with the target support surface 61 of the target support structure 60. The target exposure surface 112 may be a surface opposite to the target contact surface 111. The target exposure surface 112 may be a surface having the largest area among surfaces of the target 110, which are exposed to an empty space in the chamber 10. The target exposure surface 112 and the target contact surface 111 may be parallel to the target support surface 61. In some embodiments, the target exposure surface 112 and the target contact surface 111 may be parallel to the second direction D2 and the third direction D3 and be orthogonal to the first direction D1. However, embodiments of the inventive concept are not limited thereto.

The target exposure surface 112 may include a first target portion 112a that is closest to the substrate 120 and a second target portion 112b that is farthest from the substrate 120. The first target portion 112a and the second target portion 112b may be edge portions of the target exposure surface 112.

The substrate 120 may include a substrate exposure surface 122 and a substrate contact surface 121. The substrate contact surface 121 may be a surface that is in contact with the substrate support surface 71 of the substrate support structure 70. The substrate contact surface 121 may be a surface of the base layer 123 of the substrate 120. The substrate exposure surface 122 may be a surface opposite to the substrate contact surface 121. The substrate exposure surface 122 may be a surface of the insulating layer 124 of the substrate 120. The substrate exposure surface 122 may be a surface having the largest area among surfaces of the substrate 120, which are exposed to the empty space in the chamber 10. The substrate exposure surface 122 and the substrate contact surface 121 may be parallel to the substrate support surface 71. The substrate exposure surface 122 and the substrate contact surface 121 may be parallel to the first direction D1 and the second direction D2. The substrate exposure surface 122 and the substrate contact surface 121 may be orthogonal to the third direction D3.

The substrate exposure surface 122 may include a first substrate portion 122a that is closest to the target 110 and a second substrate portion 122b that is farthest from the target 110. The first substrate portion 122a and the second substrate portion 122b may be edge portions of the substrate exposure surface 122.

In some embodiments, the target material may be incident so that an incident angle of the target material to the entire surface of the substrate exposure surface 122 of the substrate 120 is about 9.14 degrees or less. For example, the target material may be incident so that an incident angle AN2 of the target material emitted from the second target portion 112b of the target exposure surface 112 and incident into the first substrate portion 122a of the substrate exposure surface 122 is about 9.14°.

When the material layer is formed by setting the incident angle of the target material to the entire surface of the substrate exposure surface 122 of the substrate 120 to be about 9.14° or less, all of the crystals of the material layer formed on the substrate 120 may have the same crystal orientation.

In some embodiments, the target material may be incident so that an incident angle of the target material to a portion of the substrate exposure surface 122 of the substrate 120 (e.g., a central portion of the substrate exposure surface 122) is about 9.14° or less.

When the material layer is formed so that the incident angle of the target material on the portion of the substrate exposure surface 122 of the substrate 120 is about 9.14° or less, the crystal orientations of the crystals of the portion of the material layer having an incident angle of less than about 9.14° may be the same, and the crystal orientations of the crystals of the portion of the material layer having an incident angle of more than about 9.14° may be different from each other.

The target material may be incident so that an incident angle of the target material to the substrate exposure surface 122 of the substrate 120 is about 6.45° or more. For example, the target material may be incident so that the incident angle AN1 of the target material emitted from the first target portion 112a of the target exposure surface 112 and incident into the second substrate portion 122b of the substrate exposure surface 122 is about 6.45° or more.

When the material layer is formed so that the incident angle of the target material to the substrate exposure surface 122 of the substrate 120 is about 6.45° or more, a formation rate of the material layer may be sufficient, and excessive cost and space may not be required for forming a sputtering process environment (e.g., disposition of the target 110 and the substrate 120). When the material layer is formed so that the incident angle of the target material to the substrate exposure surface 122 of the substrate 120 is less than about 6.45°, since the formation rate of the material layer is too low, the material layer may not be formed, and also, the excessive cost and space may be required for forming the sputtering process environment.

In some embodiments, an angle between a virtual straight line, which connects the target exposure surface 112 to the substrate exposure surface 122, and the substrate exposure surface 122 may be about 6.45° to about 9.14° to form the material layer on the substrate 120.

The target support structure 60 and the substrate support structure 70 may be arranged along a plane defined by the first direction D1 and the third direction D3. The target 110 and the substrate 120 may be arranged along the plane defined by the first direction D1 and the third direction D3. Thus, a sputtering direction may be parallel to the plane defined by the first direction D1 and the third direction D3. The sputtering direction may be parallel to the plane defined by the first direction D1 and the third direction D3, and the substrate exposure surface 122 of the substrate 120 may be parallel to the first direction D1 and the second direction D2, and thus, atoms in the material layer formed on the substrate 120 may be arranged in the first direction D1.

Figure 2:
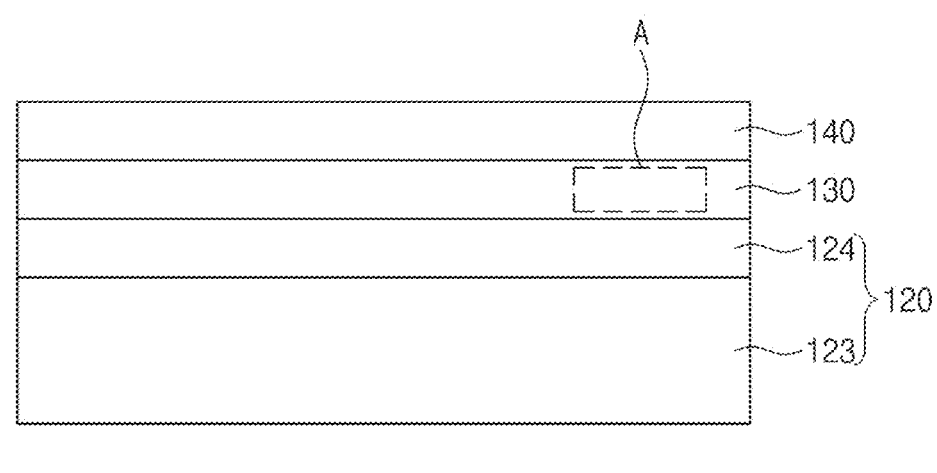
FIG. 2 is a cross-sectional view of a multilayer structure according to some embodiments.
Figure 2:
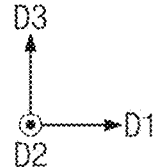
Figure 3:
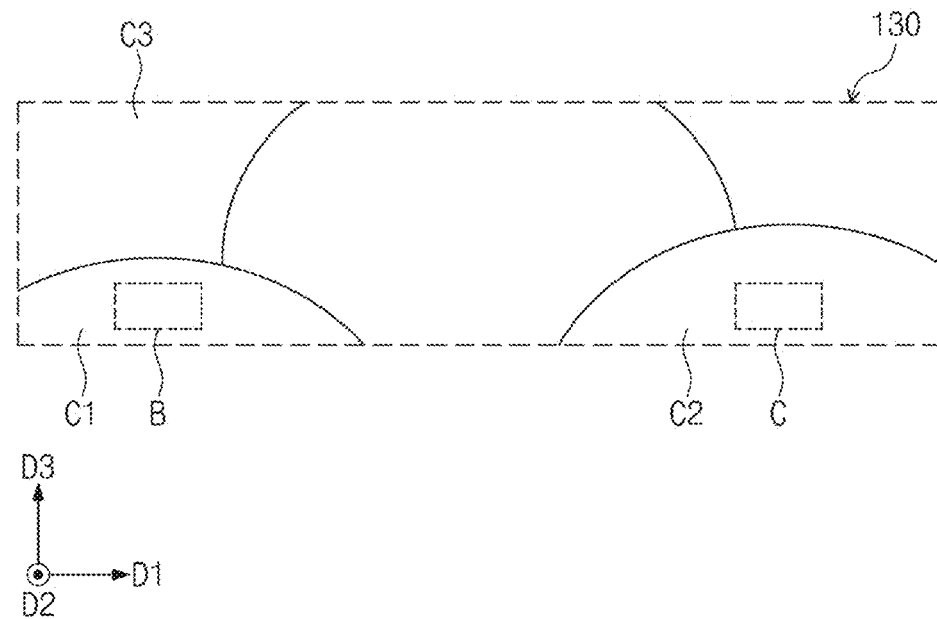
FIG. 3 is an enlarged view of an area A of FIG. 2.
Figure 4:
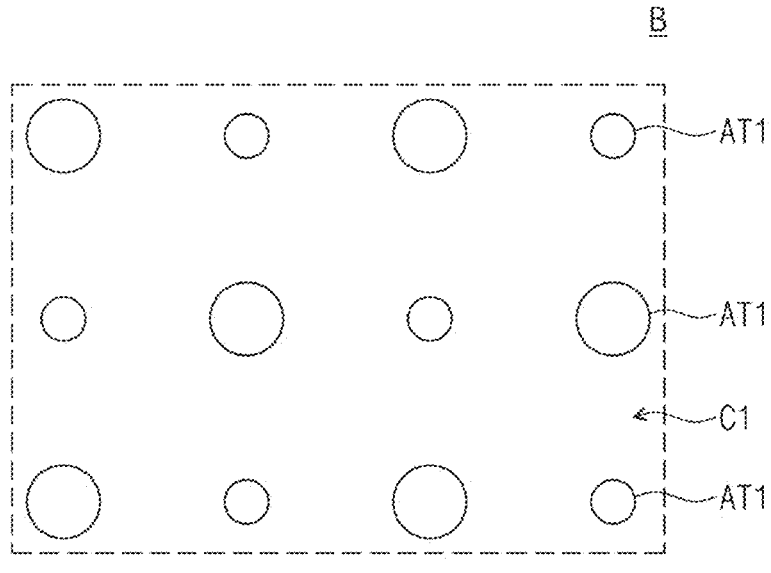
FIG. 4 is an enlarged view of an area B of FIG. 3.
Figure 4:
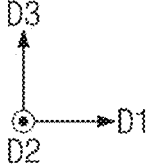
Figure 5:
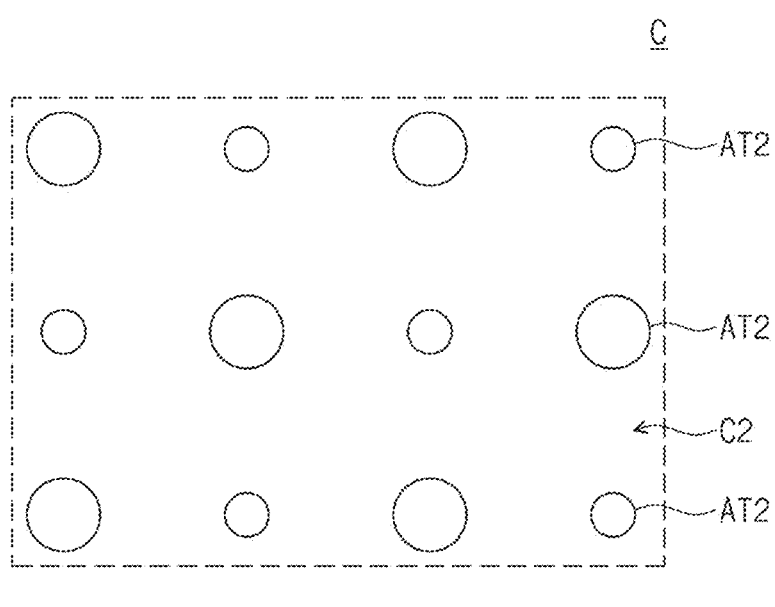
FIG. 5 is an enlarged view of an area C of FIG. 3.
Figure 5:
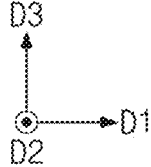
Figure 6:
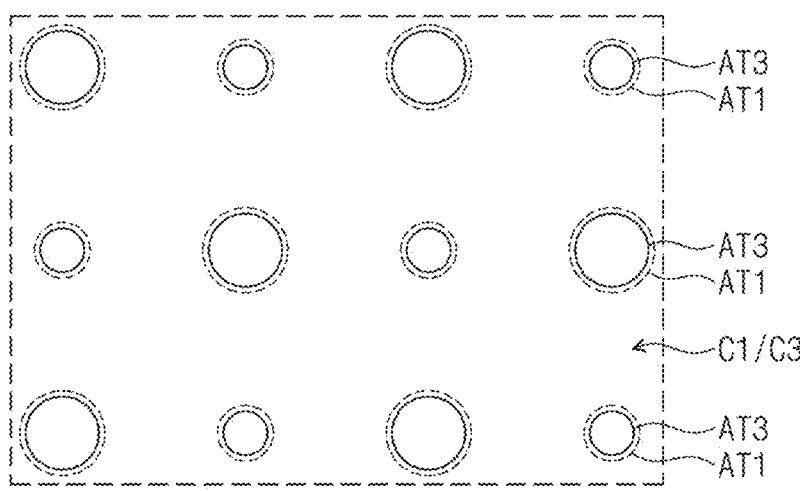
FIG. 6 is an enlarged view for explaining a planar structure of crystals, which overlap each other, of a material layer.
Figure 6:
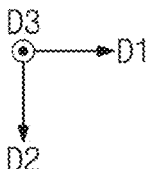

FIG. 2 is a cross-sectional view of a multilayer structure according to some embodiments. FIG. 3 is an enlarged view of an area A of FIG. 2. FIG. 4 is an enlarged view of an area B of FIG. 3. FIG. 5 is an enlarged view of an area C of FIG. 3. FIG. 6 is an enlarged view for explaining a planar structure of crystals, which overlap each other, of the material layer.

Referring to FIG. 2, a multilayer structure may include a substrate 120 including a base layer 123 and an insulating layer 124, a material layer 130 on the substrate 120, and a single crystal layer 140 on the material layer 130.

The base layer 123 may include, for example, silicon. The insulating layer 124 may include, for example, amorphous silicon oxide. The material layer 130 may include, for example, magnesium oxide or beryllium oxide. The single crystal layer 140 may be, for example, a silicon single crystal layer.

Referring to FIGS. 1 and 2, a method for manufacturing the multilayer structure includes a process of providing a substrate 120 including a base layer 123 and an insulating layer 124 on a substrate support structure 70 in a chamber 10, a process of providing a target 110 on a target support structure 60 in the chamber 10, a process of forming a material layer 130 on the substrate 120, and a process of forming a single crystal layer 140 on the material layer 130.

The material layer 130 may be formed through a sputtering process. The process of forming the material layer 130 may include a process of supplying a gas into the chamber 10 through a gas supply 40 and a process of supplying power through a power supply 30. Plasma may be generated in the chamber 10 according to the supply of the gas and the supply of the power, the target material may be discharged from the target 110 by ions of the plasma, and the target material may be incident into the substrate 120. The target material may be incident into the substrate 120 to form the material layer 130.

The crystals of the material layer 130 may have the same crystal orientation by setting an incident angle of the target material to the substrate 120 to be about 6.45° to about 9.14°.

The sputtering process may be performed in a state in which the target 110 and the substrate 120 are arranged along a plane defined by the first direction D1 and the third direction D3, and thus, the target material may be incident into the target 110 and the substrate 120, which are parallel to the plane defined by the first direction D1 and the third direction D23(the sputtering direction is parallel to the plane defined by the first direction D1 and the third direction D3), and atoms contained in the crystals of the material layer 130 may be arranged in the first direction D1.

In some embodiments, the process of forming the single crystal layer 140 may include a process of epitaxially growing the single crystal layer 140 on the material layer 130. In some embodiments, the process of forming the single crystal layer 140 may include a process of forming a poly crystal layer on the material layer 130 and a process of annealing the poly crystal layer to form the single crystal layer 140. The single crystal layer 140 may be formed using the material layer 130 as a seed layer. Since the crystals included in the material layer 130 have the same crystal orientation, it may be easy to form the single crystal layer 140 on the material layer 130.

Referring to FIGS. 3, 4, and 5, crystals C1, C2, and C3 contained in the material layer 130 may have the same crystal orientation. For example, the material layer 130 may include a first crystal C1, a second crystal C2, and a third crystal C3, and the first to third crystals C1, C2, and C3 may have the same crystal orientation. The first to third crystals C1, C2, and C3 may have a preferred orientation arrangement. Each of the first to third crystals C1, C2, and C3 may be a single crystal. A grain boundary may be provided between the first to third crystals C1, C2, and C3.

The first crystal C1 and the second crystal C2 may be arranged in the first direction D1. The first crystal C1 and the second crystal C2 may be spaced apart from each other in the first direction D1. The first crystal C1 may include first atoms AT1, and the second crystal C2 may include second atoms AT2.

When the material layer 130 includes magnesium oxide, the first atoms AT1 of the first crystal C1 and the second atoms AT2 of the second crystal C2 may be magnesium atoms or oxygen atoms. When the material layer 130 includes beryllium oxide, the first atoms AT1 of the first crystal C1 and the second atoms AT2 of the second crystal C2 may be beryllium atoms or oxygen atoms.

The arrangement direction of the first atoms AT1 of the first crystal C1 may be the same as the arrangement direction of the second atoms AT2 of the second crystal C2. The first atoms AT1 of the first crystal C1 may be arranged in the first direction D1, and the second atoms AT2 of the second crystal C2 may be arranged in the first direction D1. The first direction D1 may be, for example, a direction. The first atoms AT1 of the first crystal C1 may be arranged in the second direction D2, and the second atoms AT2 of the second crystal C2 may be arranged in the second direction D2. The second direction D2 may be, for example, a direction. The first atoms AT1 of the first crystal C1 may be arranged in the third direction D3, and the second atoms AT2 of the second crystal C2 may be arranged in the third direction D3. The third direction D3 may be, for example, a direction.

The first atoms AT1 of the first crystal C1 may be arranged in a direction parallel to and orthogonal to the substrate exposure surface 122 of the substrate 120. The second atoms AT2 of the second crystal C2 may be arranged in a direction parallel to and orthogonal to the substrate exposure surface 122 of the substrate 120.

Referring to FIGS. 3 and 6, the first crystal C1 and the third crystal C3 may overlap each other in the third direction D3. The third crystal C3 may include third atoms AT3. When the material layer 130 includes magnesium oxide, the third atoms AT3 of the third crystal C3 may be magnesium atoms or oxygen atoms. When the material layer 130 includes beryllium oxide, the third atoms AT3 of the third crystal C3 may be beryllium atoms or oxygen atoms.

The arrangement direction of the first atoms AT1 of the first crystal C1 may be the same as the arrangement direction of the third atoms AT3 of the third crystal C3. The third atoms AT3 of the third crystal C3 may be arranged in the first direction D1, the second direction D2, and the third direction D3. The third atoms AT3 of the third crystal C3 may be arranged in a direction parallel to and orthogonal to the substrate exposure surface 122 of the substrate 120.

Each of the first atoms AT1 of the first crystal C1 may overlap each of the third atoms AT3 of the third crystal C3 in the third direction D3. For example, the magnesium atoms of the first crystal C1 may overlap the magnesium atoms of the third crystal C3 in the third direction D3, and the oxygen atoms of the first crystal C1 may overlap the oxygen atoms of the third direction D3.

As described above, in the material layer 130, the first and second crystals C1 and C2 arranged in the direction parallel to the substrate exposure surface 122 of the substrate 120 may have the same crystal orientation, and the first and third crystals C1 and C3 overlapping each other in the direction orthogonal to the substrate exposed surface 122 of the substrate 120 may have the same crystal orientation.

Figure 7:
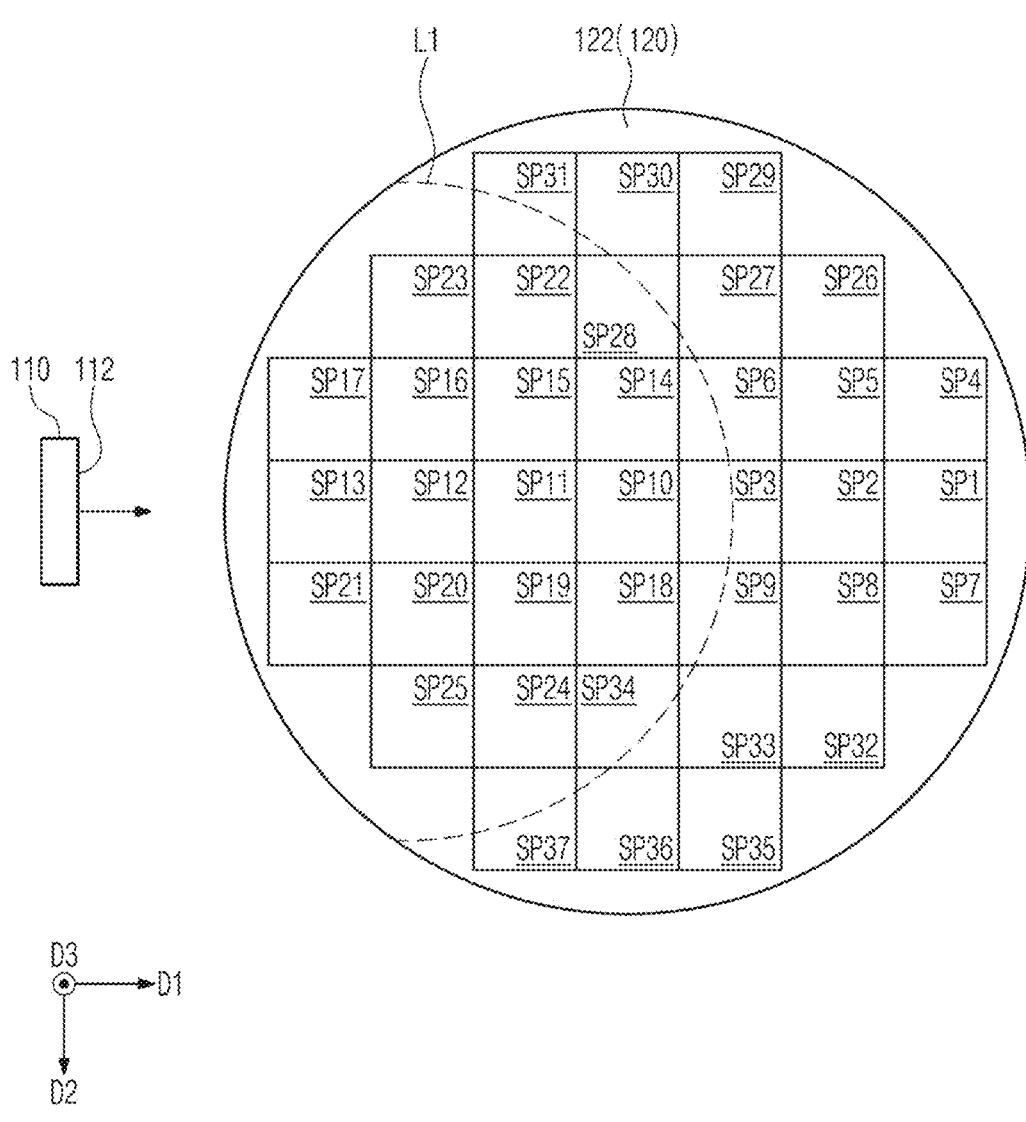
FIG. 7 is a view for explaining results of sputtering depending on spots on a substrate.
Figure 8A:
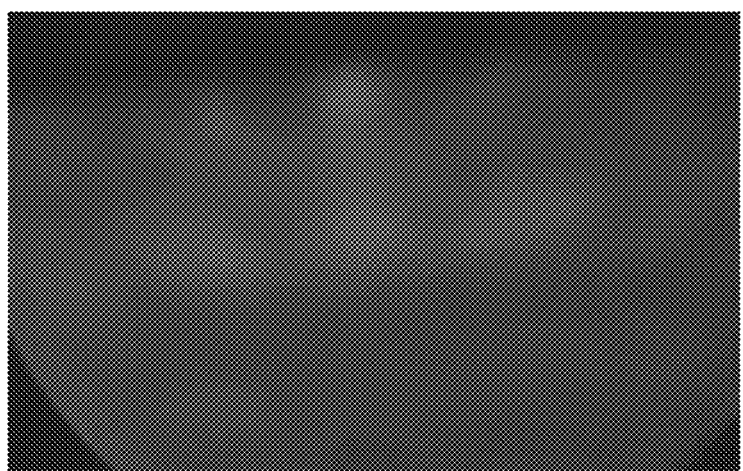
FIGS. 8A, 8B, 8C, and 8D are reflection high energy electron diffraction images of a material layer formed on spots on the substrate.
Figure 8B:
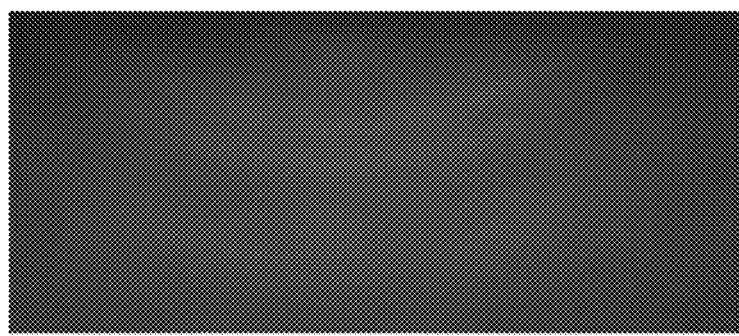
Figure 8C:
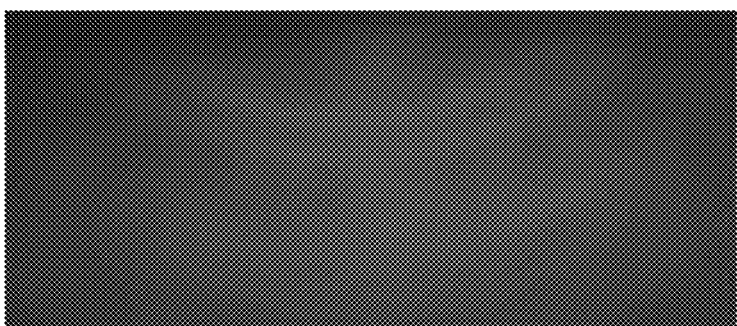
Figure 8D:
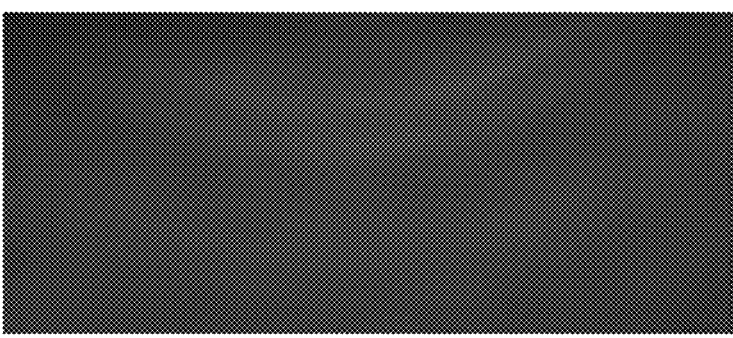

FIG. 7 is a view for explaining results of sputtering depending on spots on the substrate. FIGS. 8A, 8B, 8C, and 8D are reflection high energy electron diffraction images of the material layer formed at spots on the substrate. FIG. 8A is a reflection high energy electron diffraction image of a material layer formed at a first spot SP1 of FIG. 7, FIG. 8B is a reflection high energy electron diffraction image of a material layer formed at a sixth spot SP6 of FIG. 7, FIG. 8C is a reflection high energy electron diffraction image of a material layer formed at a ninth spot SP9 of FIG. 7, and FIG. 8D is a reflection high energy electron diffraction image of a material layer formed at a fifteenth spot SP15 of FIG. 7.

Referring to FIGS. 7, 8A, 8B, 8C and 8D, a distance between a center of the target exposure surface 112 of the target 110 and a center of the exposure surface 122 of the substrate 120 (see FIG. 1) in the first direction D1 was set to about 151.6 mm, and a distance between a center of the target exposure surface 112 of the target 110 and a center of the substrate exposure of the substrate 120 in the third direction D3 was set to about 26 mm so as to perform the sputtering. In the performed sputtering process, the target 110 included magnesium oxide, the base layer 123 (see FIG. 2) of the substrate may include silicon, the insulating layer 124 (see FIG. 2) of the substrate 120 included amorphous silicon oxide, and the substrate 120 was a 4-inch substrate.

The substrate exposure surface 122 is divided into spots SP1, SP2, SP3, . . . , SP37, which are planarly divided, and an incident angle of the target material at each of the spots SP1, SP2, SP3, . . . , SP37 was measured. A virtual line L1 connecting the points of the substrate exposure surface 122 at which the incident angle of the target material is about 9.14° was shown. The incident angle of the target material to portions of the substrate exposure surface 122 at which the distance from the target 110 is less than the distance between the line L1 and the target 110 was greater than about 9.14°. For example, the incident angle of the target material to a tenth spot SP10 was greater than about 9.14°. The incident angle of the target material to portions of the substrate exposure surface 122 at which the distance from the target 110 is greater than the distance between the line L1 and the target 110 was less than about 9.14°. For example, the incident angle of the target material to the first spot SP1 was less than about 9.14°.

The incident angle of the target material to the first spot SP1 was about 7.97°, the incident angle of the target material to the second spot SP2 was about 8.52°, and the incident angle of the target material to the third spot SP3 was about 9.14°.

It was confirmed that the crystals contained in the material layer formed at the first to ninth spots SP1, SP2, SP3, . . . , SP9 have the same crystal orientation. For example, that the crystal originations of the crystals contained in the material layer formed at the first spot SP1 of FIG. 8A, the sixth spot SP6 of FIG. 8B, and the ninth spot SP9 of FIG. 8C are the same was confirmed by a reflection high energy electron diffraction image. Thus, it was proved that the crystal orientations of the crystals of the formed material layer are the same when the incident angle of the target material is about 9.14° or less.

It was confirmed that the crystal orientations of the crystals contained in the material layer formed at the tenth to twenty-fifth spots SP10, SP11, SP12, . . . , SP25 are not the same. For example, that the crystal orientations of the crystals contained in the material layer formed at the fifteenth spot SP15 of FIG. 8D are not the same was confirmed by the reflection high energy electron diffraction image. In the case of the tenth to twenty-fifth spots SP10, SP11, SP12, . . . , SP25, the incident angle of the target material exceeded about 9.14°, and thus, the crystal orientations of the crystals were not the same.

In the case of the 26th to 37th spots SP26, SP27, SP28, . . . , SP37, the measurement of the crystal orientation was impossible because the material layer is not formed to a sufficient thickness.

According to the above results, when the material layer made of magnesium oxide is formed to a sufficient thickness while the incident angle of the target material is about 9.14° or less, it was proved that the crystal orientations of the crystals of the material layer are the same.

Figure 9:
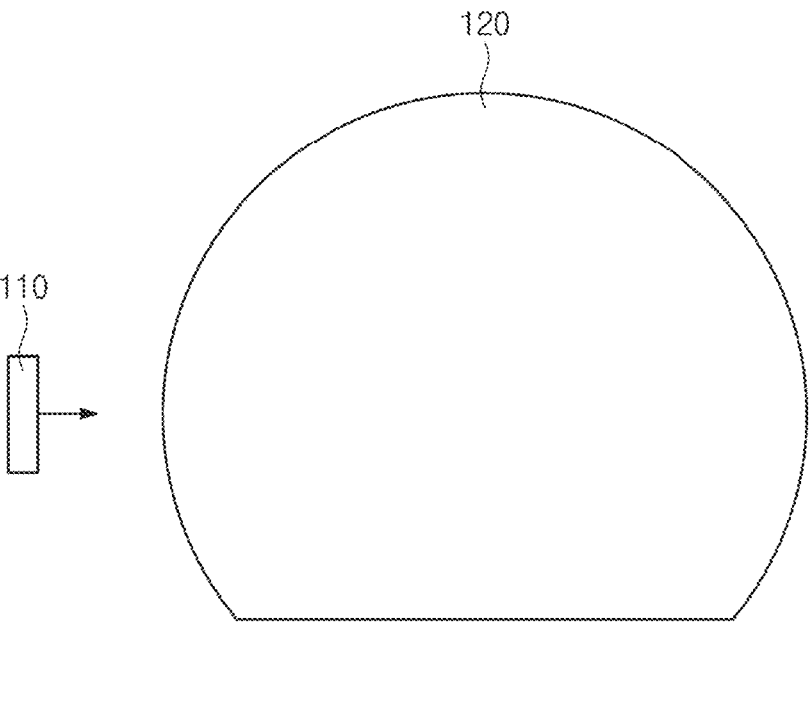
FIGS. 9, 10, 11, and 12 are views for explaining a crystal orientation of the material layer depending on a crystal orientation of a base layer of the substrate.
Figure 10:
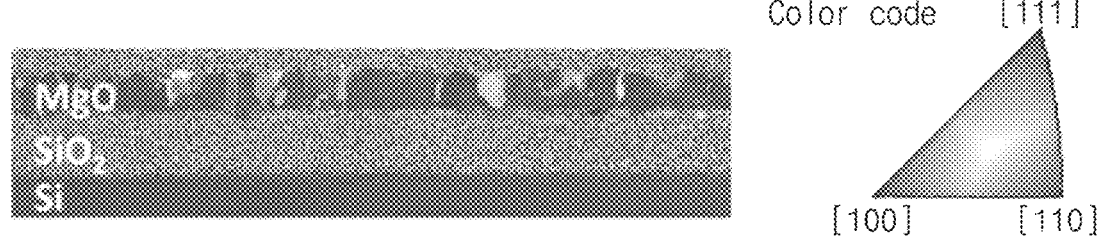
Figure 11:
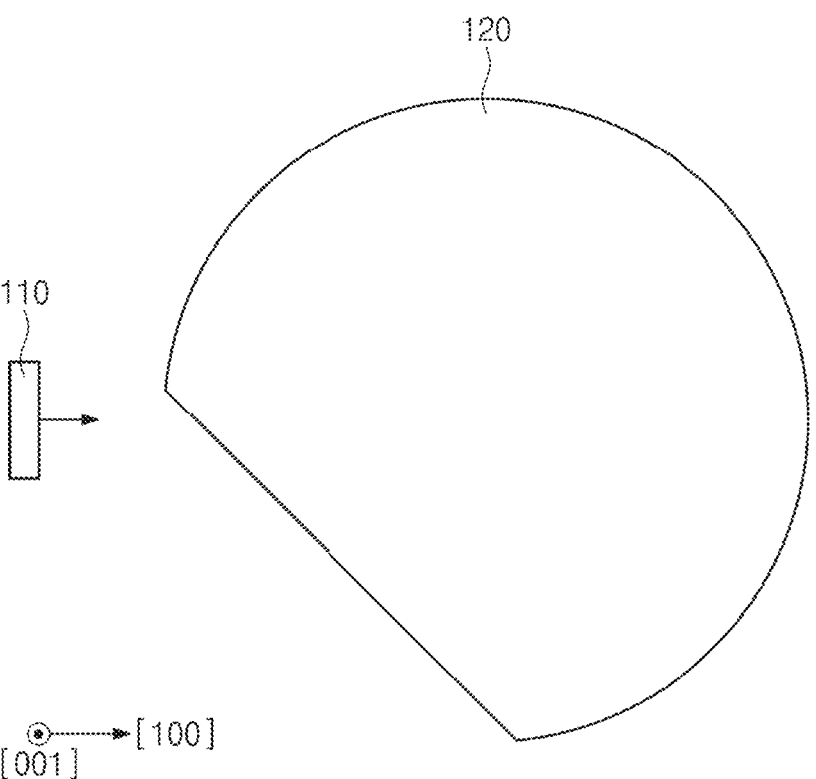
Figure 12:
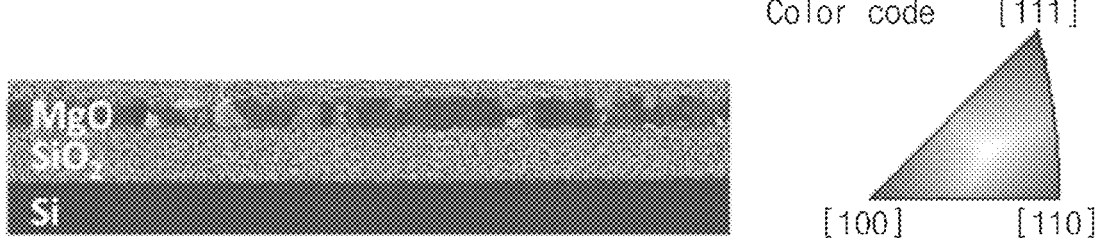

FIGS. 9, 10, 11, and 12 are views for explaining the crystal orientation of the material layer depending on the crystal orientation of the base layer of the substrate. FIGS. 9 and 10 are diagrams and images for explaining an arrangement of MgO atoms in a material layer formed in a state in which Si atoms on a (001) plane of the base layer of the substrate are arranged in a [110] direction, and FIGS. 11 and 12 are diagrams and images for explaining an arrangement of MgO atoms in a material layer formed in a state in which Si atoms on the (001) plane of the base film of the substrate are arranged in a [100] direction.

Referring to FIG. 9, in a state in which Si atoms are arranged in a direction on the (001) plane of the base layer of the substrate 120, a target material discharged from the target 110 may be incident into the substrate 120 in the direction.

Referring to FIG. 10, in the image showing the orientation of the crystals on the (001) plane, it was confirmed that the Si crystals of the base layer are arranged in the direction according to the method illustrated in FIG. 9, and it was confirmed that most of the MgO crystals of the formed material layer are arranged in the direction.

Referring to FIG. 11, in a state in which Si atoms are arranged in the direction on the (001) plane of the base layer of the substrate 120, the target material discharged from the target 110 may be incident into the substrate 120 in the direction.

Referring to FIG. 12, in the image showing the orientation of the crystals on the (001) plane, it was confirmed that the Si crystals of the base layer are arranged in the direction according to the method illustrated in FIG. 11, and it was confirmed that most of the MgO crystals of the formed material layer are arranged in the direction.

Referring to FIGS. 9 to 12, as the material layer is formed on an amorphous SiO$_2$ insulating layer of the substrate, it was confirmed that the crystal orientation of the base layer of the substrate is not related to the crystal orientation of the material layer. It was confirmed that the arrangement direction of the atoms of the material layer is determined according to the sputtering direction according to the arrangement direction of the target 110 and the substrate 120.

The method for manufacturing the multilayer structure according to the embodiments of the inventive concept may include the process of forming the material layer including the crystals having the crystal orientation.

Since the for manufacturing the multilayer structure according to the embodiments of the inventive concept includes the process of forming the material layer including the crystals having the crystal orientation, the single crystal layer may be easily formed on the material layer.

The above-described descriptions according to the embodiments of the inventive concept are exemplarily provided for explaining the inventive concept. Thus, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a multilayer structure, the method comprising:
   providing a substrate in a chamber, the substrate including a base layer and an insulating layer on the base layer, the base layer including silicon, the insulating layer including an amorphous silicon oxide;
   providing a target in the chamber of a magnetron sputtering device;
   allowing a target material that has been discharged from the target to be incident into the substrate by setting, in the magnetron sputtering device, an incident angle of the target material to the substrate to be about 6.45° to about 9.14° so as to form a material layer directly on the insulating layer, the material layer comprising a plurality of crystals of the material layer that have a same crystal orientation; and
   forming a single crystal layer on the material layer, wherein
   the target consists of magnesium oxide or beryllium oxide,
   the substrate includes a substrate exposure surface, the substrate exposure surface including a first substrate portion closest to the target in a first direction and a second substrate portion farthest from the target in the first direction, the first direction being parallel to the substrate exposure surface,
   the target includes a target exposure surface, the target exposure surface including a first target portion closest to the substrate in a second direction and a second target portion farthest from the substrate in the second direction, the second direction being perpendicular to the first direction,
   a first incident angle of the target material emitted from the first target portion of the target exposure surface and incident into the second substrate portion of the substrate exposure surface is about 6.45° or more,
   a second incident angle of the target material emitted from the second target portion of the target exposure surface and incident into the first substrate portion of the substrate exposure surface is about 9.14° or less, and the target is provided in the chamber such that the substrate exposure surface is in the first direction and the target exposure surface is in the second direction, the substrate exposure surface and the target exposure surface are spaced apart in the first direction by a certain distance and are at different heights in the second direction to implement the first incident angle of about 6.45° or more and the second incident angle of about 9.14° or less.

2. The method of claim 1, wherein
   the material layer comprises a first crystal and a second crystal,
   first atoms of the first crystal are arranged in the first direction, and
   second atoms of the second crystal are arranged in the first direction.

3. The method of claim 2, wherein the first crystal and the second crystal are spaced apart from each other in the first direction.

4. The method of claim 2, wherein the first crystal and the second crystal overlap each other in the second direction orthogonal to the substrate exposure surface.

5. The method of claim 4, wherein each of the first atoms of the first crystal overlaps a corresponding one of the second atoms of the second crystal in the second direction.

6. The method of claim 2, wherein the target and the substrate are arranged in the first direction.

7. A method for manufacturing a multilayer structure, the method comprising:
   providing a substrate in a chamber, the substrate including a base layer and an insulating layer on the base layer, the base layer including silicon, the insulating layer including an amorphous silicon oxide;
   providing a target in the chamber of a magnetron sputtering device;
   allowing a target material discharged from the target and incident into the substrate by setting, in the magnetron sputtering device, an incident angle of the target material to the substrate to be about 6.45° to about 9.14° so as to form a material layer directly on the insulating layer, the material layer comprising a plurality of crystals that have a same crystal orientation; and
   forming a single crystal layer on the material layer, wherein
   the target consists of magnesium oxide or beryllium oxide,
   the substrate includes a substrate exposure surface, the substrate exposure surface including a first substrate portion closest to the target in a first direction and a second substrate portion farthest from the target in the first direction, the first direction being parallel to a surface of the substrate,
   the target includes a target exposure surface, the target exposure surface including a first target portion closest to the substrate in a second direction and a second target portion farthest from the substrate in the second direction, the second direction being perpendicular to the first direction,
   a first incident angle of the target material emitted from the first target portion of the target exposure surface and incident into the second substrate portion of the substrate exposure surface is about 6.45° or more,
   a second incident angle of the target material emitted from the second target portion of the target exposure surface and incident into the first substrate portion of the substrate exposure surface is about 9.14° or less, and

the target is provided in the chamber such that the substrate exposure surface is in the first direction and the target exposure surface is in the second direction, the substrate exposure surface and the target exposure surface are spaced apart by a certain distance in the first direction and are at different heights in the second direction to implement the first incident angle of about 6.45° or more and the second incident angle of about 9.14° or less.

8. The method of claim 7, wherein forming the single crystal layer comprises epitaxially growing the single crystal layer on the material layer using the material layer as a seed layer.

9. The method of claim 7, wherein forming the single crystal layer comprises:

forming a poly crystal layer on the material layer; and annealing the poly crystal layer to form the single crystal layer.

10. The method of claim 7, further comprising:

supplying power to a target support structure configured to support the target through a power supply.

11. The method of claim 7, further comprising:

supplying a gas into the chamber through a gas supply and a mass flow controller that connects the gas supply to the chamber.

12. A method for driving a magnetron sputtering device, the method comprising:

providing a substrate on a substrate support structure within a chamber, the substrate including a base layer and an insulating layer on the base layer, the base layer including silicon, the insulating layer including an amorphous silicon oxide;

providing a target on a target support structure within the chamber of the magnetron sputtering device;

supplying a gas into the chamber;

supplying power to the target support structure and setting, in the magnetron sputtering device, an incident angle of a target material discharged from the target to the substrate to be about 6.45° to about 9.14° so that the target material is incident into the substrate so as to form a material layer directly on the insulating layer, the material layer comprising a plurality of crystals that have a same crystal orientation; and forming a single crystal layer on the material layer, wherein the target consists of magnesium oxide or beryllium oxide, the substrate includes a substrate exposure surface, the substrate exposure surface including a first substrate portion closest to the target in a first direction and a second substrate portion farthest from the target in the first direction, the first direction being parallel to a surface of the substrate, the target includes a target exposure surface, the target exposure surface including a first target portion closest to the substrate in a second direction and a second target portion farthest from the substrate in the second direction, the second direction being perpendicular to the first direction, a first incident angle of the target material emitted from the first target portion of the target exposure surface and incident into the second substrate portion of the substrate exposure surface is about 6.45° or more, a second incident angle of the target material emitted from the second target portion of the target exposure surface and incident into the first substrate portion of the substrate exposure surface is about 9.14° or less, and the target is provided within the chamber such that the substrate exposure surface is in the first direction and the target exposure surface is in the second direction, the substrate exposure surface and the target exposure surface are spaced apart by a certain distance in the first direction and are at different heights in the second direction to implement the first incident angle of about 6.45° or more and the second incident angle of about 9.14° or less.

13. The method of claim 12, wherein atoms of the plurality of crystals of the material layer are arranged in the first direction, and the target support structure and the substrate support structure are arranged in the first direction.

* * * * *